United States Patent [19]

Fujimoto

[11] 3,798,752

[45] Mar. 26, 1974

[54] METHOD OF PRODUCING A SILICON GATE INSULATED-GATE FIELD EFFECT TRANSISTOR

[75] Inventor: Syoji Fujimoto, Tokyo, Japan

[73] Assignee: Nippon Electric Company Limited, Tokyo, Japan

[22] Filed: Mar. 7, 1972

[21] Appl. No.: 232,451

[30] Foreign Application Priority Data

Mar. 11, 1971 Japan .............................. 46-13230

[52] U.S. Cl. .................................... 29/571, 29/578

[51] Int. Cl. ............................................ B01j 17/00

[58] Field of Search .............................. 29/571, 578

[56] References Cited

UNITED STATES PATENTS

| | | | |
|---|---|---|---|
| 3,673,471 | 6/1972 | Klein et al. | 29/571 |
| 3,576,478 | 4/1971 | Watkins | 29/571 |

*Primary Examiner*—Charles W. Lanham
*Assistant Examiner*—W. C. Tupman
*Attorney, Agent, or Firm*—Sandoe, Hopgood & Calimafde

[57] ABSTRACT

A method is disclosed for fabricating an insulated gate field effect transistor having a silicon gate electrode. The silicon gate electrode is covered with a first insulating layer. That layer as well as the surfaces of the source and drain regions are thereafter covered with a second insulating layer. The second insulating layer is selectively removed to expose a portion of the first insulating layer covering the silicon gate electrode and a part of the surfaces of the source and drain regions. Source and drain electrodes are then respectively applied to the source and drain regions without the possibility of a drain-to-gate or source-to-gate short circuit.

9 Claims, 9 Drawing Figures

METHOD OF PRODUCING A SILICON GATE INSULATED-GATE FIELD EFFECT TRANSISTOR

This invention relates generally to insulated-gate field effect transistors (hereinafter referred to as IGFETs) employing polycrystalline silicon film as a gate electrode, and more particularly to semiconductor integrated circuitry using transistors of this type.

It is known that the use of polycrystalline silicon as the gate electrode of an IGFET improves the integration density and the operating speed of the insulated-gate field effect semiconductor integrated circuitry that employ these transistors. However, the reduction in element size has been found to be limited in the known silicon gate IGFET constructions, because of the limitation on the photoetching techniques that are used for the formation of contact holes through which electrodes are derived from the source and drain diffused regions.

It has heretofore been common practice to install the source and drain contact holes at locations sufficiently removed from the gate electrode to avoid possible short-circuit contact between the source or drain electrodes and the gate electrode, because of the anticipated alignment errors in photoetching and the tendency of expansion of the holes due to excessive etching during the formation of the contact holes. In a silicon gate IGFET, the required spacing between the source or drain contact hole and the gate electrode has not been reduced as compared with the corresponding reduction that has been achieved in the conventional IGFET. As a result of this limitation, the advantage of the silicon gate IGFET that the source-gate and gate-drain electrodes may be overlapped has not been properly utilized.

A reduction in element size contributes not only to an increase in integration density, but also to a reduction in the capacitance of the gate electrode, the source region, and the drain region and hence, to an increase in the operating speed of the integrated circuitry.

It is an object of this invention to eliminate the aforedsaid limitation on the source and drain contact holes in a silicon gate IGFET, and to provide a much more compact silicon gate IGFET construction than has heretofore been attained.

The method of producing a silicon gate IGFET according to this invention comprises the steps of covering the silicon gate electrode with a first layer of insulating material, thereafter covering the first layer of insulating material and the source and drain regions with a second layer of insulating material, and forming contactholes for deriving the source and the drain electrodes in the second layer of insulating material by etching the second layer at the areas extending from the surface of the source and drain regions to the surface of the first layer of insulating material which overlies the silicon gate. In this method, although masking holes for the formation of contact holes overlap with a portion of the silicon gate electrode in photoetching for the formation of the contact holes, there is no likelihood or possibility that the contact holes may be in contact with the silicon gate electrode. This is because the first layer of insulating material is present between the silicon gate electrode and the contact holes when the holes are formed by the etching of the second layer and the surfaces of the source and drain regions are exposed. Therefore, the positions at which the source and drain electrodes are derived can be sufficiently close to the silicon gate electrode and hence, silicon gate transistors with relatively small areas can be fabricated.

Now the invention will be described more in detail by reference to the accompanying drawings, in which.

Figure 1A:
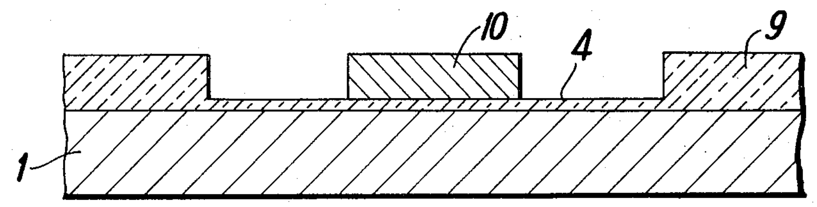
FIGS. 1A through 1F are respectively schematic cross sectional views illustrating successive fabrication steps in the production of an IGFET according to one embodiment of this invention.

As shown in FIG. 1A, a portion of an insulating layer 9 formed on a semiconductor substrate 1 is removed and a gate insulator film 4 of a predetermined thickness less than the remaining portion of insulating layer 9 is newly formed in this portion. In the intermediate position on gate insulator film 4, a gate electrode 10 of polycrystalline silicon is formed. The structure of FIG. 1A so far described is essentially that of a conventional silicon gate IGFET.

Figure 1B:
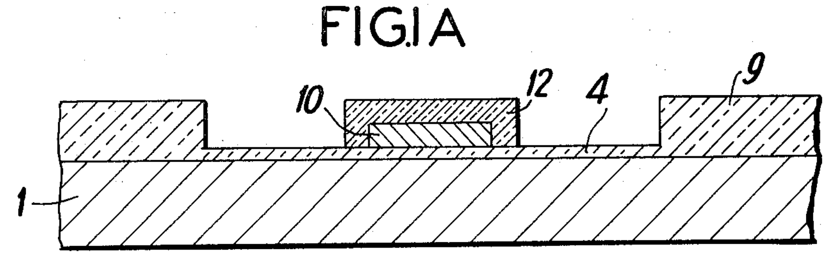

According to this invention as illustrated in FIG. 1, the exposed surface (the top and side faces) of the silicon gate electrode 10 is covered with a first insulating layer 12, as shown in FIG. 1B. The use of silicon oxide is convenient for both the gate insulator film 4 and the first insulating layer 12. In that case, the first insulating layer 12 must be thicker than the gate insulator film 4, for example, 2,000 A for the former and 1,000 A for the latter.

In order to selectively form a relatively thick first insulating layer 12 on the surface of only the silicon gate electrode 10, anodic oxidation may be, as herein shown performed for the gate electrode 10 to convert the surface of the silicon gate into a silicon oxide film. This is achieved by immersing the entire structure shown in FIG. 1A into a suitable electrolytic solution with a negative and a positive potential applied to an opposing platinum electrode and the polycrystalline silicon gate 10 respectively, so that an oxide film insulating layer 12 may be formed on the surface of the silicon gate electrode 10. In this case, the anodic oxidation progresses only on the silicon gate surface to which the potential is applied. Therefore, the oxide film insulating layer 12 can be prepared optionally to be thicker than the gate oxide insulator film 4. N-methyl acetamide dissolved with a salt such as $KNO_3$ is a suitable electrolytic solution for this process.

Figure 1C:
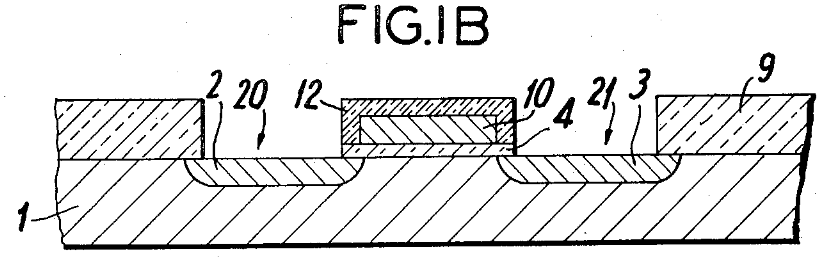

After the first insulating layer 12 has been formed, the silicon oxide insulator layers 9, 4 and 12 are uniformly etched without the necessity of using any mask according to the known process used in the fabrication of silicon gate IGFET. By this etching process, the thinnest insulating layer 4 is the first of the silicon oxide layers be removed, be and the source and drain diffusion holes or recesses 20 and 21 are formed as illustrated in FIG. 1C. Since, as mentioned previously, the first insulating layer 12 covering the surface of the silicon gate electrode 10 is thicker than the gate insulator film 4, the former still remains in spite of the etching process. As a next step, impurity diffusion is performed through the source and drain diffusion holes 20 and 21 to form the source and drain regions 2 and 3 of a conductivity type opposite to that of the substrate, also as shown in FIG. 1C.

Figure 3:
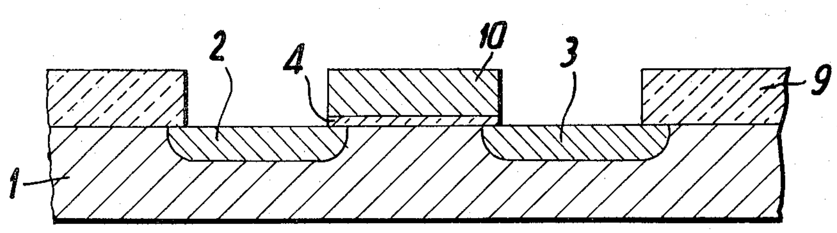
FIG. 3 is a schematic cross sectional view illustrating an alternative fabrication step for the embodiments of this invention.

The anodic oxidation for the formation of the insulating layer 12 need not necessarily be performed through the step of FIG. 1B. The diffusion process for the source and drain regions may be performed in advance as shown in FIG. 3, before the gate electrode 10 is subjected to anodic oxidation to form the insulating layer 12 as shown in FIG. 1C. In this case, the above-mentioned limitation is no longer imposed on the thickness of the insulating layer 12.

Figure 1D:
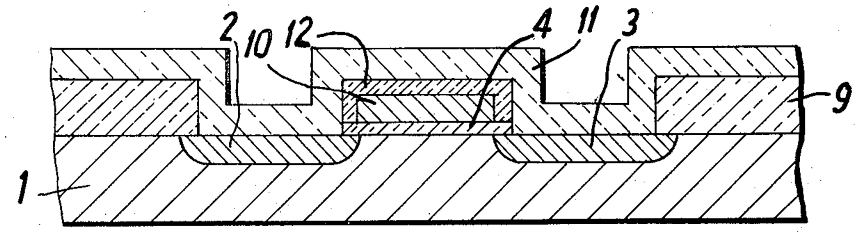
Figure 1E:
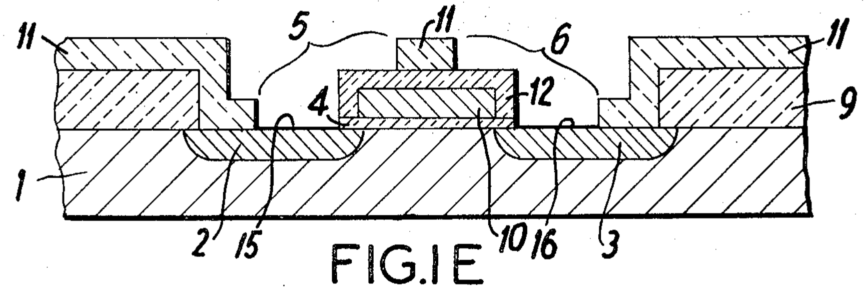
Figure 1F:
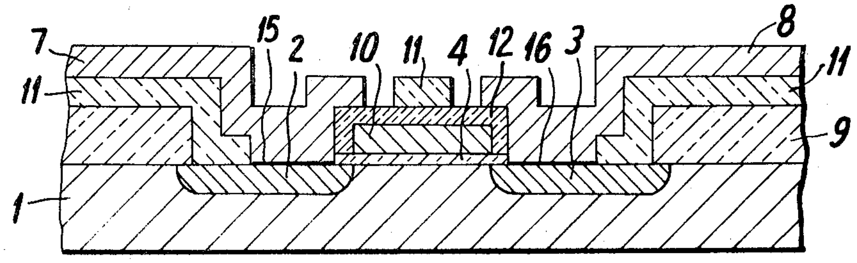

The entire surface of the structure of FIG. 1C is then covered with a second insulating layer 11, as shown in FIG. 1D, and etching is performed to provide contact holes in the second insulating layer 11 to derive electrodes from the source and drain regions 2 and 3. In this case, the area where the etching for the contact holes is to be performed is not separated from the gate electrode 10 as in the conventional process, rather is provided so as to be partially overlapped with the gate electrode 10. In other words, as shown in FIG. 1E, the etching areas 5 and 6 for the source and drain contact holes are overlapped, in part, with the gate electrode 10, as viewed in a direction normal to the substrate surface. It will be evident that at the moment the contact holes 15 and 16 to the source and drain regions 2 and 3 are provided after the removal of the second insulating layer 11, the gate electrode 10 remains in a state of being protected by the first insulating layer 12. Accordingly, the final aluminum wiring layer can be provided as shown in FIG. 1F, without any possibility of the occurrence of a short-circuit between source electrode 7 and gate electrode 10, or between drain electrode 9 and gate electrode 10.

The surface of the source and drain regions 2 and 3 other than those portions underlying the source and drain contact holes 15 and 16 is covered with the second insulating layer 11. The main purpose of this coverage is to permit other wiring layers to traverse across the covered surface in an integrated circuit structure.

In this manner, the limitation on the contact hole locations that has existed for the conventional silicon gate IGFET is eliminated and contact holes for the source 2 and drain 3 can thus be installed in proximity to the gate electrode. This results in the realization of extremely small transistor structure.

This invention can be applied to the production of a silicon gate IGFET having a gate insulator of a dual structure such as one composed of a film of silicon nitride, for example, which is impervious to oxygen even at elevated temperature and prevents oxidation of the underlying material, and a silicon oxide film.

Figure 2A:
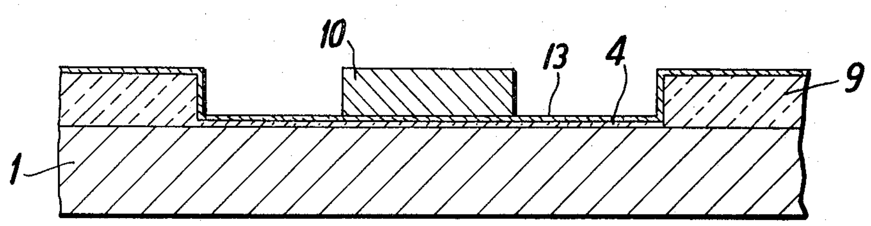
FIGS. 2A and 2B are respectively schematic cross sectional views illustrating fabrication steps for another embodiment of this invention.
Figure 2B:
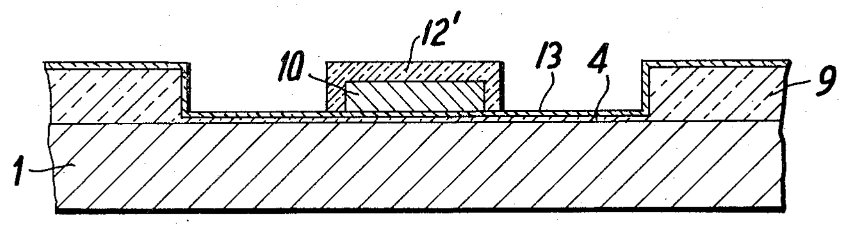

To be more specific, as shown in FIG. 2A, the entire silicon oxide insulating surface is covered with a silicon nitride film 13 after the formation of gate insulator film 4 and a polycrystalline silicon electrode 10 is formed thereon at a predetermined position. On subjecting this structure to thermal oxidation at high temperature, the oxidation does not progress significantly on the side of the substrate that is covered with silicon nitride film 13 and hence, the thickness of the gate oxide film 4 remains unchanged. Therefore, an oxide film 12' is grown by this oxidation process only on the surface of the silicon gate 10 and is able to be made thicker than the gate insulator film 4 by a desired amount. Thus, the structure as shown in FIG. 2B corresponding to FIG. 1B, is obtained. The fabrication process thereafter is similar to that shown in FIGS. 1C to 1F.

A silicon nitride film may be used in a manner mentioned above, even in cases where the gate insulator film 4 is made only of silicon oxide or other materials. In detail, after the formation of a silicon gate electrode 10 as shown in FIG. 1A, or after the formation of the source and drain regions 2 and 3 as shown in FIG. 3, the entire surface of the substrate except for the surface of the silicon gate electrode 10 is covered with a silicon nitride film and then the surface of the silicon gate electrode 10 is thermally oxidized, thereby forming a silicon oxide film only over the surface of the silicon gate.

In the above-mentioned examples, both the first insulating layer 12, 12' and the second insulating layer 11 are made of silicon oxide. However, a similar effect can be obtained by the use of any insulating materials for the first and second insulating layers as meet the condition that a material for one layer cannot be dissolved by an etching solution of a material for the other layer and vice versa. Examples of such materials are silicon nitride for one of the first and second insulating layers and silicon dioxide for the other layer; alumina for one layer and silicon dioxide for the other layer; silicon nitride for one layer and alumina for the other; etc.. Each of silicon nitride, alumina and silicon dioxide can be deposited from the vapor phase by a well known method. Even if different materials are used for the first and second insulating layers, the first insulating layer may be formed subsequently to the step shown either in FIG. 1A or FIG. 3. At any rate, it is only required that the formation of the first insulating layer take place prior to the formation of the second insulating layer.

According to the structural feature of this invention, the gate electrode 10 is covered with the first insulating layer and the source and drain regions 2 and 3 are covered with the second insulating layer. Accordingly, the polycrystalline silicon gate electrode 10 is still protected by the first insulating layer at the moment the second insulating layer is removed to form the contact holes in the etching process of the second insulating layer. Therefore, the etching area for the contact holes may extend to portions opposing the gate electrode without performing a rigorous alignment during the photoetching process of the second insulating layer. This results in increased facility of manufacture, the possibility of increased proximity to the gate electrode of the contact positions to the source and drain regions, and the reduction in size of the silicon gate IGFET, that is, an increase in the integration density of an integrated circuitry using the IGFET fabricated as herein described.

The existence of the second insulating layer 11 left on the first insulating layer 12 shown in FIGS. 1E and 1F is not essential in this invention. Therefore, the photoetching area for the formation of contact holes 15 and 16 may have a comprehensive shape extending from a part of the source region, 2 over the gate electrode 10, to a part of the drain region 3. In an operation in which the same material is used for the first and second insulating layers 12, 12' and 11, the discrimination between these layers becomes obscure in the completed structure.

Thus while the present invention has been herein described with respect to several presently preferred embodiments thereof, it will be appreciated that variations and modifications may be made therein, all without departing from the spirit and scope of the invention.

We claim:

1. A method of producing an insulated-gate field effect transistor with a silicon layer as a gate electrode, said method comprising the steps of forming a gate insulator film on a part of the surface of a semiconductor substrate, forming a polycrystalline silicon layer on said gate insulator in the shape of said gate electrode, forming source and drain regions in said substrate, covering the exposed surfaces of said gate electrode with a first insulating layer, covering the surface of said substrate including the surface of said first insulating layer and the surface of each of said source and drain regions with a second insulating layer, selectively removing said second insulating layer to expose at least a part of the surface of said first insulating layer and a part of the surface of each of said source and drain regions, and respectively attaching an electrode to said exposed part of the surface of each of said source and drain regions.

2. The method of claim 1, in which said step of covering the exposed surface of said silicon layer with a first insulating layer is performed after said step of forming a polycrystalline silicon layer and before said step of formimg source and drain regions.

3. The method of claim 1, in which said first insulating layer is formed of silicon oxide.

4. The method of claim 3, in which said first insulating layer is formed by the anodic oxidation of said silicon layer.

5. The method of claim 3, further comprising the step of covering the surface of said semiconductor substrate except for the surface of said silicon layer with a silicon nitride layer before said step of covering the exposed surface of said silicon layer with a first insulating layer, said first insulating layer being formed by thermally oxidizing said silicon layer.

6. The method of claim 3, in which said second insulating layer is formed of silicon oxide.

7. The method of claim 3, in which said second insulating layer is formed of silicon nitride.

8. The method of claim 1, in which said first insulating layer is formed of silicon nitride or alumina and said second insulating layer is formed of silicon oxide.

9. The method of claim 8, in which said second insulating layer is formed of alumina.

* * * * *